United States Patent [19]

Koslar

[11] 4,210,862
[45] Jul. 1, 1980

[54] TEST DEVICE FOR INDICATING AN ELECTRIC VOLTAGE AND/OR THE POLARITY THEREOF, AND THE PASSAGE OF CURRENT THROUGH AN ELECTRIC CONDUCTOR

[75] Inventor: Manfred Koslar, Rheda-Wiedenbrueck, Fed. Rep. of Germany

[73] Assignee: Siemens Aktiengesellschaft, Berlin & Munich, Fed. Rep. of Germany

[21] Appl. No.: 895,960

[22] Filed: Apr. 13, 1978

[30] Foreign Application Priority Data

| Apr. 21, 1977 [DE] | Fed. Rep. of Germany | 2717286 |
| Aug. 2, 1977 [DE] | Fed. Rep. of Germany | 2734833 |
| Aug. 5, 1977 [DE] | Fed. Rep. of Germany | 2735374 |
| Aug. 5, 1977 [DE] | Fed. Rep. of Germany | 7724448[U] |
| Dec. 20, 1977 [DE] | Fed. Rep. of Germany | 2756830 |

[51] Int. Cl.$^2$ .................... G01R 31/02; G01R 19/16; G01R 1/06
[52] U.S. Cl. .................... 324/51; 324/72.5; 324/133; 324/149
[58] Field of Search ............ 324/51, 72.5, 133, 149, 324/53

[56] References Cited

U.S. PATENT DOCUMENTS

| 2,794,167 | 5/1957 | Jones | 324/53 |
| 3,870,950 | 3/1975 | Laass | 324/133 X |
| 4,015,201 | 3/1977 | Chaffee | 324/149 X |
| 4,028,621 | 6/1977 | Bloxam | 324/133 X |

FOREIGN PATENT DOCUMENTS

| 180330 | 5/1954 | Austria | 324/149 |
| 212925 | 1/1961 | Austria | 324/149 |
| 2060884 | 6/1972 | Fed. Rep. of Germany | 324/133 |

OTHER PUBLICATIONS

Todd, *A Sub-Ohm Continuity Tester,* Electronics World, Feb. 1969, pp. 78–80.

*Primary Examiner*—Gerard R. Strecker
*Attorney, Agent, or Firm*—Hill, Van Santen, Steadman, Chiara & Simpson

[57] ABSTRACT

A test device for determining the voltage and/or polarity thereof and the amount of current passing through an electric conductor has two pencil-like probes with electrical contact tips electrically connected together through a plurality of circuit elements. At least one probe has a hollow handle portion in which there is mounted a ceramic cold current limiting resistor connected to the contact tip of one of said probes, a pair of luminescent diodes connected as an antiparallel circuit to the resistor, a keying switch having a movable contact and a first and a second stationary contact. The movable switch contact is connected to the opposite end of the antiparallel diode circuit from the resistor. One stationary contact of the switch is connected to the contact tip of the second probe, while the other stationary contact is connected to the second probe tip through a battery and a protective diode. A guard ring is preferably provided on each probe around its housing to prevent the hand of a user from accidentally slipping down the housing into contact with the contact tip.

2 Claims, 7 Drawing Figures

TEST DEVICE FOR INDICATING AN ELECTRIC VOLTAGE AND/OR THE POLARITY THEREOF, AND THE PASSAGE OF CURRENT THROUGH AN ELECTRIC CONDUCTOR

FIELD OF THE INVENTION

The invention relates to a test device for indicating an electric voltage and/or the polarity thereof and of the passage of current through an electric conductor. The test device consists of two handles connected by an electric cable and contains two luminescent diodes connected in antiparallel fashion which are preceded by a ceramic cold conductor serving as current limiting resistor.

BACKGROUND OF THE INVENTION

The German AS 20 60 884 describes a test device for indicating the polarity and the phase state of electric potentials relative to a given reference potential, wherein two luminescent diodes connected in antiparallel fashion with a preceding current limiting resistor are employed. The two luminescent diodes are arranged in protected fashion in at least one opening in a pencil-like housing which simultaneously contains a current limiting resistor and at its end side bears a metal point. The walls of the pencil-like housing possess an opening through which the light output of two luminescent diodes can be viewed externally. The two luminescent diodes are connected in antiparallel fashion and connected on the one hand via the current limiting resistor to the metal point and on the other hand to a test line which leads out of the pencil-like housing. In the testing of a d.c. voltage, in accordance with the polarity, one or the other luminescent diode is illuminated whereas in the testing of an a.c. voltage both luminescent diodes are illuminated.

If the current limiting resistor is in the form of a ceramic cold conductor which—as is known—consists of ferro-electric material on a base of n- and/or p-doped barium titanate and in the region of the Curie temperature exhibits a sudden increase in its electrical resistance by approximately 4 powers of ten, this device can be used to check voltages from approximately 2 V and up to 500 V. The ceramic cold conductor exerts a protective function upon the luminescent diodes in that it limits the current flow by virtue of self heating above the Curie temperature and an associated considerable increase in resistance.

However, in many cases it is not only of interest whether a device is connected to current or whether a voltage is present and the nature of the polarity thereof, but in many cases it is also to be confirmed whether an electric conductor, an electric component, an electric assembly and the like is traversed by current. This checking of the passage of current and eventually e.g. by semiconductor devices the direction of current flow (continuity) is therefore of particular interest.

Current passage checking devices operate in accordance with the principle that a current is conducted from a voltage source through the electrical conductor which is to be checked. An acoustic or optical signal then indicates whether there is a passage of current or not.

The U.S. Pat. No. 3,870,950 describes an input protection circuit for electric current passage checking device which contains a separate current source and a current flowing indicator for testing voltage-free circuits and for protection from alien voltages which could jeopardize the current flow indicator, a semiconductor switch and a cold-conducting resistor connected in series, where the free ends represent the input terminals and the current source and the current flow indicator are connected in series and the free ends of this series arrangement are connected on the one hand to the free end of the semiconductor switch and on the other hand to the connection point between semiconductor switch and cold conducting resistor.

BRIEF SUMMARY OF THE INVENTION

The aim on which the present invention is based consists in rendering the test device known, per se for indicating an electric voltage and/or the polarity thereof, also suitable for use as test device for the passage of current and its direction through an electric conductor; and furthermore protection functions are provided which serve to increase the reliability of the device, and the test device preferably contains all the electrical components in only one handle.

For the realization of this aim, the test device of the type described in the introduction is characterized in accordance with the present invention in that one of the handles contains a battery with a preceding protective diode and is provided with a keying switch. A protective diode and battery are connected in series and connected to the contact, which can be switched in. There is also a keying switch, which, in the rest position, is connected to a contact of the parallel line which bridges the battery and the protective diode, and that this arrangement of a keying switch, a battery and a protective diode is connected in series with the antiparallel arrangement of the luminescent diodes.

Preferably, the keying switch is arranged in front of a slip ring, known per se.

Preferably the test device is characterized in that connected in parallel with the keying switch, there is arranged a Zener diode.

In order that only one larger handle be required, with the second handle simply bearing a contact point, the test device is characterized in accordance with the invention in that the arrangement of all the components of the circuit lie in one handle of the keying switches on the other side of the slip ring opposite the luminescent diodes, and that the battery is accommodated with its poles between clamping contact springs in an adapted recess in a housing which can be extracted from the handle and which itself, in the inserted state, can be engaged in the handle by means of projections.

If all the components of the circuit are accommodated in only one handle, the keying switch, relative to the slip ring, can be arranged on that side of the handle which is embraced by the hand. Opposite this keying switch, on the other side of the slip ring, the luminescent diodes are then arranged and in fact either on a line parallel to the axis of the handle or transversely thereto.

The battery is arranged in an extractable housing which is designed in such a manner that the outer periphery of the handle cannot be changed when the housing is inserted.

It is advantageous to accommodate the ceramic cold conductor which serves to limit the current and the protective diode for the battery in the handle in such a manner that when the battery housing is withdrawn they are accessible from the exterior.

If a Zener diode is arranged in parallel to the keying switch, it is advantageous to accommodate it in the one handle in such a manner that is is accessible when the battery housing is extracted.

It can occur that, when the battery housing is extracted, the contacts which touch the battery are exposed so that when the test device is used to indicate an electric voltage the contact springs can be touched by a finger or even by a screwdriver so that if the keying switch is simultaneously misoperated these contact springs are subject to the possibly high voltage when the protective diode which bridges the keying switch breaks down.

In order to avoid this, the battery housing is designed in such a manner that contact of this kind is impossible and that also danger in the event of the misoperation of the keying switch during a voltage check can simultaneous breakdown the protective diode which bridges the keying switch when the battery is incorrectly inserted is avoided.

For this purpose the test device is characterized in accordance with the invention in that the housing can only be opened to such an extent that the opening of the recess in the handle of the test device still remains closed.

Preferably the base part of the housing is provided with projections which limit its extraction.

Furthermore, it is advantageous for the housing to contain a cylindrical cavity for the accommodation of the battery, one side of which is bounded by an opening into which only the plus pole of the battery fits, and the other side of which is open in accordance with the diameter of the battery, whose length between the two sides corresponds to the length of the battery without plus pole, and that the length of the opening on the handle is matched to the length of the housing.

In the following, the invention will be explained making reference to the exemplary embodiments and the attached drawing.

DESCRIPTION OF THE PREFERRED EMBODIMENTS

Figure 1:
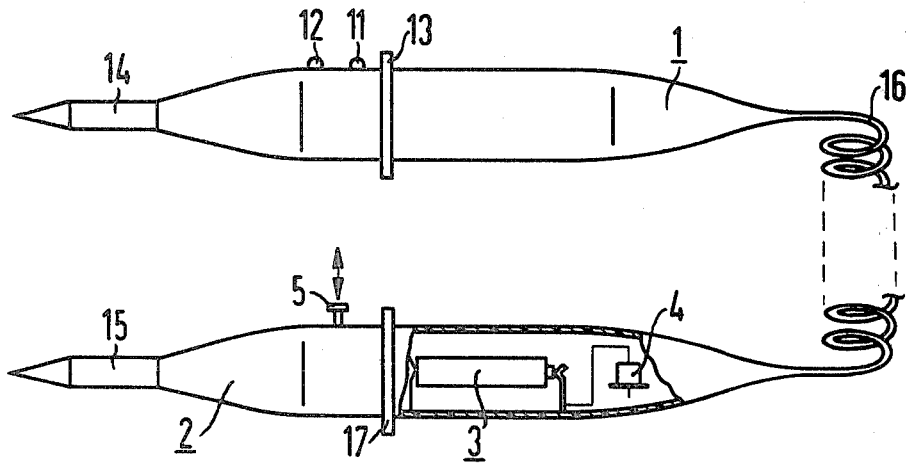
FIG. 1 illustrates the test device.

In accordance with FIG. 1, the test device consists of two handles 1 and 2 which simultaneously represent the housing or housings for the electrical components and electrical lines required in the test device.

The handle 1 possesses the two luminescent diodes 11 and 12 which are visible from the exterior. The ring 13 which surrounds the handle serves as protection for a finger slipping into the voltage source. The metal point 14 at one end of the handle 1 serves as contact element between the test device and the line which is to be checked. The same applies to the contact point 15 on the handle 2. The two handles are connected to one another by the cable 16.

The handle 2 possesses a continuous ring 17 which likewise serves as protection from a finger slipping onto the line to be tested. The keying switch 5 is arranged on the portion between metal point 15 and ring 17. In the handle 2 there is also accommodated a battery 3 and a protective diode 4 which, together with the circuit elements contained in the handle, are wired in accordance with the circuit diagram in FIG. 2.

The battery, the protective diode and the keying switch 5 can also be accommodated in the handle 1. In this case, the function of the handle 2 is simply to allow the test device to be handled (see FIGS. 4 and 5).

Figure 2:
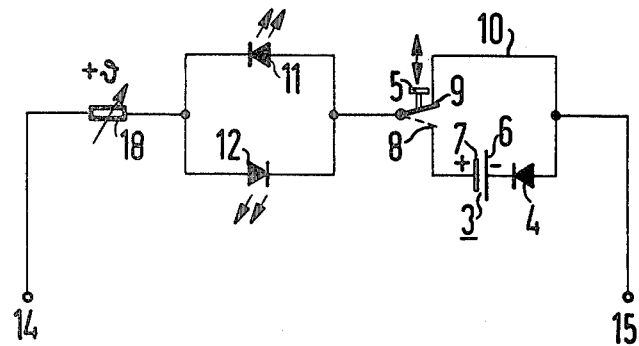
FIG. 2 illustrates the circuit diagram of a preferred embodiment of the present invention.

In FIG. 2, the terminal points 14 and 15 correspond to the metal points of the test device. The cold conductor 18 is connected in series to the antiparallel arrangement of the luminescent diodes 11 and 12. Likewise arranged in series with this antiparallel arrangement is the keying switch 5 which in the rest position is connected to the contact line of the parallel line 10. The keying switch 5 is of spring construction and is actuated in the event of the current passage check so that a contact with the terminal 8 occurs as a result of which the battery 3 with the plus pole and minus pole 6, and the protective diode 4 are switched into the circuit.

The test device operates as follows

In the event of the voltage test, the keying switch 5 is in the normal position so that a voltage connected to the ends 14 and 15 flows across the cold conductor and one of the two luminescent diodes which is thus caused to illuminate. In the case of a.c. voltage, both luminescent diodes are illuminated, and in the case of high voltages the cold conductor is heated beyond its Curie temperature so that its resistance increases suddenly. As a result the luminescent diodes are protected from too high voltages.

In the case of the current passage test, the keying switch 5 is switched over so that a current is fed from the battery 3 through the line to be tested.

In the circuit serving as a current passage test device, an a.c. voltage or d.c. voltage could be erroneously connected to the metal points 14 and 15. With a corresponding polarity, this could produce a charging current and thus a gas discharge in specific battery elements and in the case of an encased design could lead to its destruction. In the test device in accordance with the invention, the ceramic cold conductor resistor which is anyhow provided for the protection of the luminescent diodes is also exploited to protect the battery and thus has a combined effect which eliminates the danger of destruction virtually, and in fact because the cold conductor requires a specific length of time in order to become high-ohmic by self heating. Here the protective diode 4 which is incorporated into the protective circuit of the type in question comes into operation.

The batteries can consist both of primary or secondary elements, e.g., a 12 V monocell. In place of the protective diodes, it is also possible to use another semiconductor circuit element such as for example a transistor or a triac provided the same function is ensured.

Figure 3:
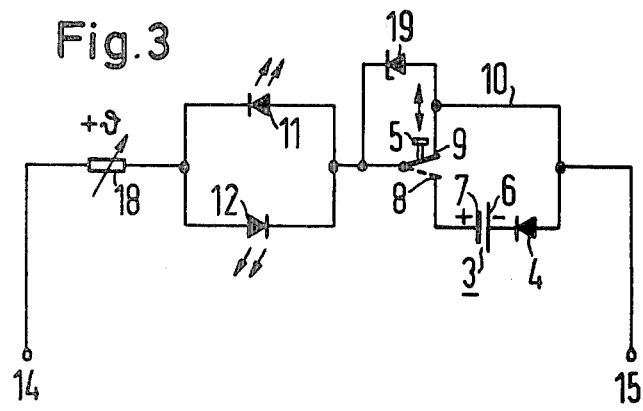
FIG. 3 illustrates the curcuit diagram of another preferred exemplary embodiment.

In the circuit shown in FIG. 3, in addition to the circuit illustrated in FIG. 2, a Zener diode 19 is connected in parallel to the keying switch 5 and connected to the bridging parallel line 10.

In practice the Zener diode 19 exerts three further protective functions. Firstly, the keying switch 5 is protected from high voltages. Secondly, during the testing of high voltages, mistaken actuation of the keying switch 5 is to be prevented from leading to breakdown of the battery 3 and/or the protective diode 4. Thirdly, provision is made for the event in which no battery 3 is inserted or the battery is discharged so that misunderstandings in the current passage testing are eliminated.

The forwards voltage of the Zener diode 19 should be selected in accordance with the voltage of the battery 3. A Zener diode for 15 V is particularly suitable in the case of battery voltages of less than 15 V, e.g., 12 V.

In accordance with FIG. 4, the test device again consists of two handles 1 and 2. Whereas here the handle 2 merely has the function of bearing the contact point 15 and is provided with a slip ring 17, the handle 1 which is connected to the handle 2 via the line 16 contains all the components of the circuits illustrated in FIGS. 2 and 3.

At the end opposite to the transition into the line 16, the handle 1 is provided with a contact pin 14. The luminescent diodes 11 and 12 are arranged between contact point 14 and slip ring 13 so that they are eailly visible.

The handle 1 also possesses the keying switch 5 and in fact relative to the slip ring 13 opposite the luminescent diodes 11 and 12, i.e., on that side of the handle 1 which is enclosed by the hand.

Within the handle 1 is arranged the battery 3 which lies with its poles 6 and 7 between the clamping contact springs 20 and 21. The battery 3 is accommodated in a housing 22 which itself is provided with an opening 23 matched to the battery.

The projection 24 serves to allow the extractable housing 22 to be engaged into the wall of the housing 1 in the inserted state.

In order to extract the battery 3 from the recess 23 of the housing 22, the wall thereof is partially removed at one end 25 so that free areas are formed on both sides of the battery end through which the battery can be gripped.

When the housing 22 has been extracted, an opening remains through which the components cold conductor 18, protective diode 4 and Zener diode 19 are accessible from the exterior.

Figure 4:
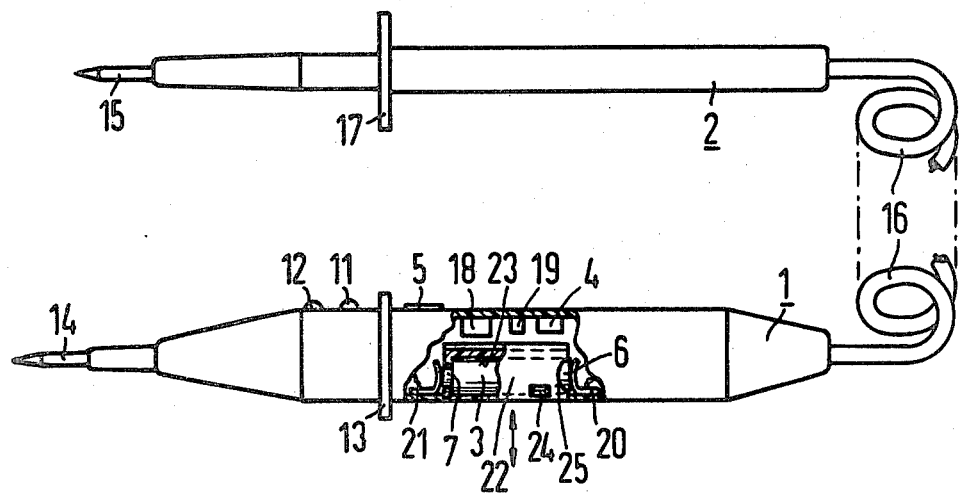
FIG. 4 shows another embodiment of the present invention.

In accordance with FIG. 5, the test device again consists of two handles 1 and 2 so that in this respect the explanations relating to FIG. 4 apply.

Figure 5:
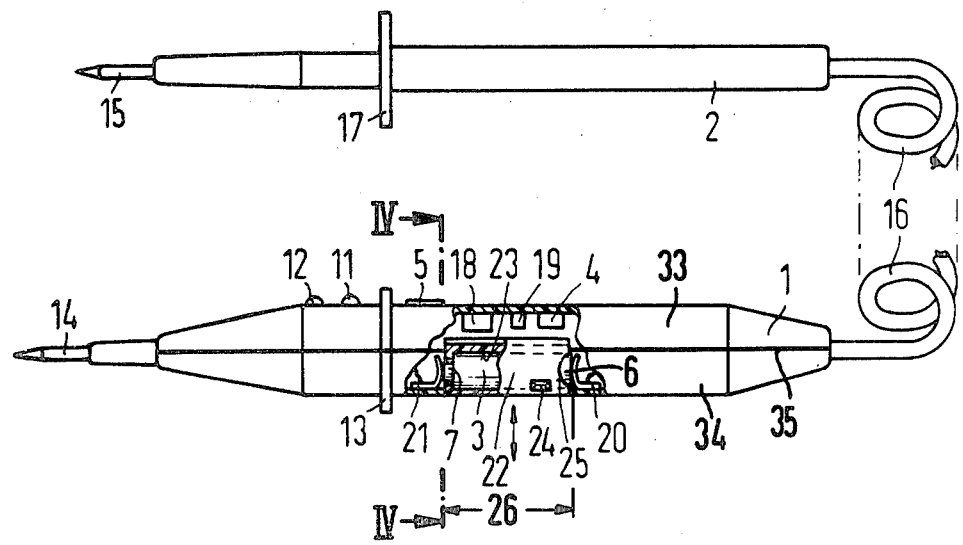
FIG. 5 shows a further embodiment of the test device.
Figure 6:
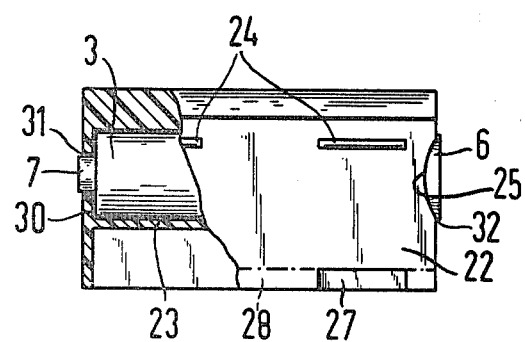
FIG. 6 is a view, partly in section, of the battery housing.

FIG. 6 illustrates the housing 22 with the recess 23 in which the battery 3 can be accommodated, in the form of a cylindrical cavity. The recess 23 is closed at the left-hand side 30 in the Figure in such a manner that only the plus pole 7 of the battery passes through the opening 31. On the other side, the opening of the recess 23 corresponds to the cross-section of the battery 3. The length of the recess 23 between the sides 30 and 32 corresponds exactly to the length of the battery without plus pole 7, so that when the battery is incorrectly inserted into the recess 23, the plus pole 7 projects towards the right. If the housing 22 were impressed into the opening 26 (FIG. 5) of the handle 1, the plus pole 7 would in this case prevent complete insertion because it projects beyond the outer dimensions of the housing 22.

Figure 7:
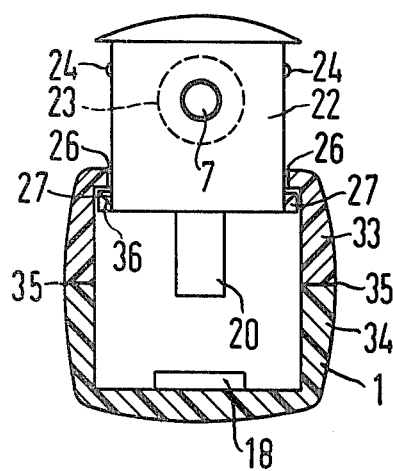
FIG. 7 is a section along the line IV—IV in FIG. 5, in the case where the battery housing has been extracted.

In accordance with FIG. 7, the housing 22 has been extracted from the handle 1. However, the housing cannot be completely extracted because this is prevented by the projections 27 (FIG. 6). In place of the projections 27 it is also possible to provide a bead 28 which extends along the entire length of the housing 22. Since, when the housing 22 is in this limited state of extraction in accordance with FIG. 7, the opening 26 remains closed as beforehand, it is not possible to touch the contact 20 or the contact 21. The projections serve to lock the housing 22 in the fully inserted state.

It is most advantageous to install the housing 22 into the handle 1 when this handle is itself assembled. The handle 1 in fact consists of two havles 33 and 34, as indicated in FIG. 5 and FIG. 7, which are firmly glued to one another along the line 35. Prior to this glueing, the handle half 33 can be elastically deformed in the region of the opening 26 to such an extend that the battery housing can be inserted. The glueing of the two handle halves 33 and 34 along the line 35 cancels this elasticity, so that the housing 22 can no longer be extracted if the handle halves are not simultaneously disassembled.

It is naturally also possible to bevel the projections as indicated in FIG. 7 by the line 36 so that the projections act, as it were, as barb. In this case the battery housing can be installed following the assembly of the handle 1 by forceful pressure and can then no longer be extracted.

This embodiment of the invention ensures that when the test device is used to indicate a voltage, in the event of the misactuation of the keying switch 5 and possibly the breakdown of the protective diode 19 which bridges this keying switch 5, two types of danger are prevented from occurring, namely on the one hand due to the touching of the contacts 20 and 21 and on the other hand due to the misinsertion of the battery into the recess 23 in that the minus pole 6 of the battery 3 lies in the recess in such a manner that is incorrectly touches the contact 21 and does not—as is correct—touch the contact 20. Naturally, the touching of the contacts 20 and 21 by the user in the event of the misactuation of the key 5 during the display of a voltage is of primary importance.

It will be apparent to those skilled in the art that many modifications and variations may be effected without departing from the spirit and scope of the novel concepts of the present invention.

I claim as my invention:

1. A test device for indicating an electrical voltage and/or the polarity thereof, as well as the passage of current through an electrical conductor, comprising two handles, which are connected by means of a cable and are provided with contact tips, and one of the handles contains two luminous diodes connected antiparallelly and preconnected to a ceramic cold conductor as a current limiting resistor and for testing for passage of current through an electrical conductor, the following features are present:
   (a) a battery (3) connected in series with a protective diode (4) mounted in one of the handles (1), in which said cold conductor (18) and the luminous diodes (11, 12) are housed;
   (b) a keying switch (5) and a Zener diode (19) connected in parallel and mounted in said handle (1);
   (c) the series connection of the battery (3) and protective diode (4) connected to a normally open contact (8) of a keying switch (5), which is normally connected with a switch contact (9) connected to a parallel line (10), which bridges the battery (3) and the protective diode (4);
   (d) the keying switch (5), Zener diode (19), battery (3) and protective diode (4) connected in series with the antiparallel connection of the luminous diodes (11, 12);

(e) the battery (3) is housed with positive and negative terminals (6, 7) in a removeable housing (22), which, by means of projections (24) in the inserted state, engage the handle (1) and is removeable only to an extent such that the opening (26) of the recess (23) in the handle (1) remains closed.

2. A test device according to claim 1, characterized in that the housing (22) contains a cylindrical cavity (23) for receiving of the battery (3), and said cavity has one side (30) which is limited by an opening (31), into which only the positive terminal of the battery fits, and the other side (32) of said cavity has an opening which corresponds to the diameter of the battery, the length of said cavity between the two sides (30, 32) corresponds to the length of the battery (3) less said positive terminal (7), the length of the opening (26) in the handle (1) is less than the length of the housing (22), and the housing (22) is provided on its bottom side with projections (27, 28) which limit the distance it can be removed from said handle.

* * * * *